United States Patent [19]

Kosugi et al.

[11] Patent Number: 5,369,789
[45] Date of Patent: Nov. 29, 1994

[54] BURST SIGNAL TRANSMITTER

[75] Inventors: Hiroaki Kosugi, Hirakata; Takayuki Matsumoto, Kadoma; Takashi Enoki, Yokohama, all of Japan

[73] Assignee: Matsushita Electric Industrial Co Ltd., Osaka, Japan

[21] Appl. No.: 188,115

[22] Filed: Jan. 28, 1994

Related U.S. Application Data

[63] Continuation of Ser. No. 955,257, Oct. 1, 1992, abandoned.

Foreign Application Priority Data

Jan. 10, 1991 [JP] Japan .................. 3-253354

[51] Int. Cl.$^5$ .................. H04B 1/04; H03G 3/20
[52] U.S. Cl. .................. 455/126; 455/127; 330/129
[58] Field of Search .................. 455/12.1, 115, 117, 455/127, 126, 343, 89, 249, 69, 91, 116; 330/129, 131, 141

[56] References Cited

U.S. PATENT DOCUMENTS

| | | |
|---|---|---|
| 4,633,510 | 12/1986 | Suzuki et al. . |
| 4,904,954 | 2/1990 | Otake et al. .................. 330/141 |
| 4,992,753 | 2/1991 | Jenson et al. . |
| 5,023,937 | 6/1991 | Opas . |
| 5,095,542 | 3/1992 | Suematsu et al. .................. 455/127 |
| 5,101,176 | 3/1992 | Norimatsu .................. 455/126 |
| 5,113,525 | 5/1992 | Andoh .................. 455/115 |
| 5,126,686 | 6/1992 | Tam .................. 455/126 |
| 5,128,629 | 7/1992 | Trinh .................. 455/126 |
| 5,144,258 | 9/1992 | Nakanishi et al. .................. 455/126 |

FOREIGN PATENT DOCUMENTS

| | | |
|---|---|---|
| 2236636 | 10/1991 | United Kingdom . |
| WO91/03108 | 3/1991 | WIPO . |
| WO91/12661 | 8/1991 | WIPO . |

OTHER PUBLICATIONS

"Committee Letter Ballot TR-45.3 Digital Cellular Systems", Telecommunications Industry Association, Sep. 25, 1991, pp. 8-24.

Primary Examiner—Reinhard J. Eisenzopf
Assistant Examiner—Nguyen Vo
Attorney, Agent, or Firm—Wenderoth, Lind & Ponack

[57] ABSTRACT

A power amplifier amplifies a modulated carrier signal having an amplitude modulation component and a phase modulation component to generate a transmission signal. Part of the transmission signal is extracted by a monitor circuit. The detection signal detected by an envelope detector is compared with a burst control signal by a differential amplifier. The resulting error signal is input to a gain control terminal of a power amplifier through a sample and hold circuit, thus forming a feed-back loop. The sample and hold circuit outputs a sample signal during the transmission signal ramping-up and ramping-down periods, thus effectively turning ON the feed-back loop to an ON to control the transmission signal ramping-up and ramping-down. The sample and hold circuit outputs the hold signal during a modulated data transmission period, effectively turning OFF the feedback loop. As a result, a burst transmission output with a stable transmission power level can be obtained.

9 Claims, 10 Drawing Sheets

BURST SIGNAL TRANSMITTER

This application is a Continuation of now abandoned application Ser. No. 07/955,257, filed Oct. 1, 1992.

BACKGROUND OF THE INVENTION

1. Field of the Invention

The present invention relates to a transmitter for radio communications equipment which use a digital modulation system, such as a U.S. digital cellular system, having an amplitude modulation component and a phase modulation component for the purpose of supplying a stable burst-state transmission output.

2. Description of the Prior Art

Conventional radio communications equipment of this type generally use frequency modulation. One of the most typical examples of this conventional system is found in analog cellular telephone systems.

The transmitter in such frequency modulation radio communications equipment uses a feedback loop to control the transmitter output. In this feedback loop, a detector detects part of the transmitter output signal, which is amplified by a power amplifier; the detected signal is compared with a reference voltage signal by a differential amplifier, and a gain control terminal is controlled according to the resulting error signal. However, while this feedback loop control system is effective with frequency modulation systems in which an amplitude modulation component is not used, it cannot be used in digital modulation systems using both amplitude and phase modulation components. The feed-back loop functions to track and cancel the amplitude modulation component of the transmitter output signal, and is known to distort the modulated output signal. In addition, if the time constant of the feed-back loop is increased so that the amplitude modulation component is not tracked, a burst-state transmission signal that ramps up/down at high speed cannot be obtained.

SUMMARY OF THE INVENTION

Therefore, an object of the present invention is to provide a sample and hold circuit in the feed-back loop of the transmitter output control sequence to switch the feed-back loop on/off and thereby obtain a stable burst-state transmitter output.

To achieve this object, a burst signal transmitter according to the preferred embodiment of the invention comprises a modulator for generating a modulation carrier signal, and for generating a signal during the burst ramp-up period for use as a constant envelope; a power amplifier having a gain control terminal, and obtaining the transmission signal by amplifying the input modulation carrier signal; a monitor circuit for extracting part of the transmission signal from the power amplifier as the monitor signal; a detector for obtaining the detection signal by envelope detection of the monitor signal; burst control circuits for generating the burst control signal and sample and hold signal; a differential amplifier for comparing the burst control signal and detection signal to output the difference voltage; and a sample and hold circuit for sampling and holding the difference voltage according to the sample and hold signal, and for controlling the gain control terminal of the power amplifier by the output from the sample and hold circuit.

In further preferred embodiments, the effects of jitter at the start of the ramp-down period resulting when the sample-hold circuit shifts from the hold state to the sample state can be reduced by controlling a second gain control terminal in the power amplifier, or by controlling a multiplier positioned after the sample-hold circuit.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DESCRIPTION OF PREFERRED EMBODIMENTS

Figure 1:
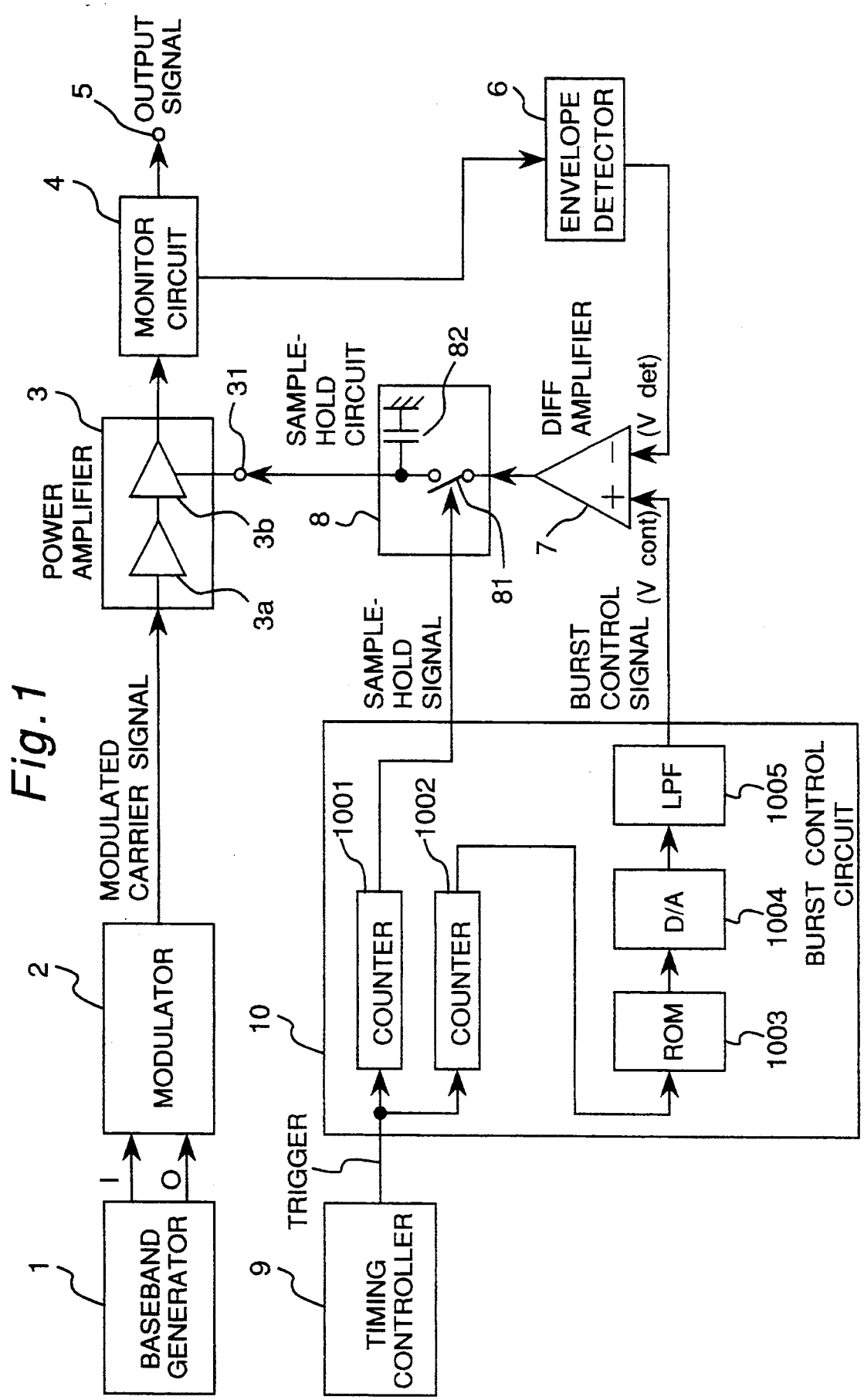
FIG. 1 is a block diagram of a transmitter according to a first embodiment of the present invention.
Figure 2:
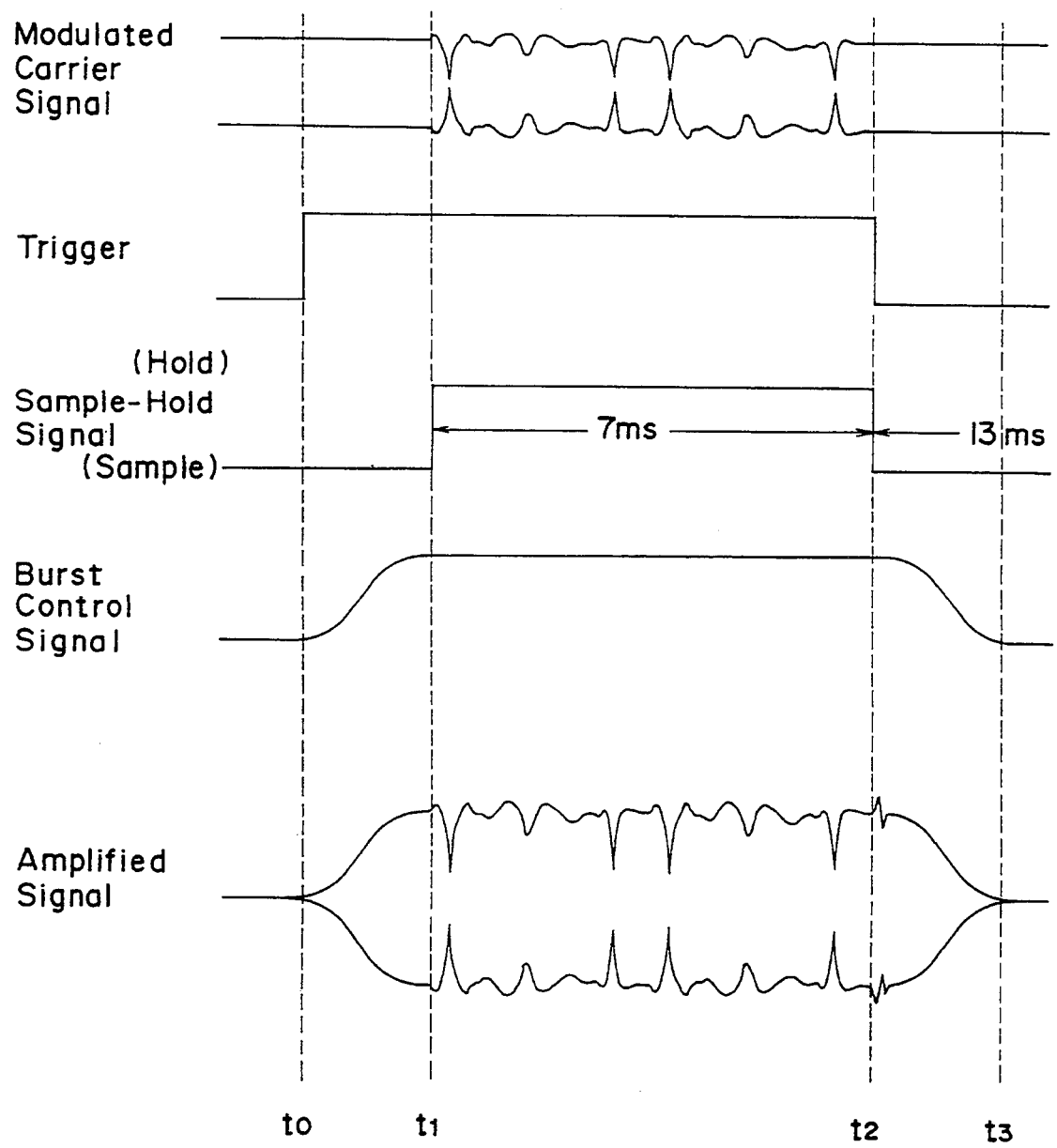
FIG. 2 is a timing chart of the transmitter shown in FIG. 1.

The preferred embodiments of the present invention are described hereinbelow with reference to the accompanying figures, of which FIGS. 1 and 2 are a block diagram and a timing chart of a transmitter according to the first embodiment, respectively.

Referring to FIG. 1, a burst signal transmitter according to the first embodiment of the invention comprises: generator 1 for generating modulation signals (I, Q); a modulator 2 for generating a modulation carrier signal based on, for example, a QPSK modulation system; a power amplifier 3 comprising first and second amplifiers 3a and 3b and a gain control terminal 31 of the second amplifier 3b, and producing the transmission signal by amplifying the modulated carrier signal; a monitor circuit 4 for extracting part of the transmission signal from the power amplifier 3 for use a monitor signal; a transmission signal output terminal 5; an envelope detector 6 for obtaining and outputting the detection signal Vdet by envelope detection of the monitor signal output from the monitor circuit 4; a differential amplifier 7 for comparing the detection signal Vdet with an burst control signal Vcont to output a error signal; a sample and hold circuit 8 having a switch 81 and a capacitor 82 for sampling and holding the error signal according to a sample and hold signal, and for producing a gain control signal which is supplied to the gain control terminal 31 of the amplifier 3b; a timing controller 9 for generating a trigger signal which controls the start and end of a signal transmission; and a burst control circuit 10, for generating the burst control signal Vcont and the sample and hold signal. The burst control circuit 10 has first and second counters 1001 and 1002 activated by the trigger signal, a ROM 1003 carrying a predetermined rising (ramping-up) and falling (ramping-down) patterns for the burst control signal, a digital-to-analog converter 1004, and a low pass filter 1005 for removing the clock pulses.

The first counter 1001 is provided for forming the and signal such that, in response to the leading edge of the trigger signal, a first predetermined time t0-t1, shown in FIG. 2, is counted so that the sample-hold signal is changed from a LOW to a HIGH level at time t1, and then in response to the trailing edge of the trigger signal, the and signal is changed from a HIGH to a LOW level. The and signal is supplied to the switch 81 for turning on and off when the sample and hold signal is at a LOW and HIGH level, respectively.

The second counter 1002, ROM 1003, D/A converter 1004 and low pass filter 1005 are provided for forming the burst control signal such that, in response to the leading edge of the trigger signal, a first predetermined time t0-t1 is counted during which time the ROM 1003 reads gradually increasing data to form the ramping-up pattern and, in response to the trailing edge of the trigger signal, a second predetermined time t2-t3 is counted during which time the ROM 1003 reads gradually decreasing data to form the ramping-down pattern.

The operation of the transmitter shown in FIG. 1 is described below with reference to the timing chart shown in FIG. 2. In FIG. 2, the period t0-t1 is the transmission signal ramping-up period, t1-t2 is the modulated data transmission period, and t2-t3 is the transmission signal ramping-down period. The transmission starting time t0 and the transmission ending time t2 are provided by the leading edge and trailing edge of the trigger signal from the timing controller 9.

In operation, it is assumed that the burst signal transmitter of the present invention is applied to the US digital cellular system, and that a digital audio signal, such as a digital voice signal, is transmitted. The detail of the US digital cellular system is disclosed in "COMMITTEE LETTER BALLOT TR-45.3 DIGITAL CELLULAR SYSTEM" PN-2759 DUAL MODE BASE STATION COMPATIBILITY STANDARD (REVISION OF IS-54A) by TELECOMMUNICATIONS INDUSTRY ASSOCIATION and issued Sep. 25, 1991, which is incorporated herein by reference. The digital audio signal has been previously compressed and is transmitted in segments. Each segment continues, for example, 7 milliseconds determined by the holding period of the sample and hold signal, and the neighboring segments are spaced, for example, 13 milliseconds apart.

First, the operation during the transmission signal ramping-up period t0-t1 is described. During this period, switch 81 in the sample and hold circuit 8 is maintained closed, and at the same time, the modulated carrier signal output from the modulator 1 is a constant envelope signal having no audio signal carried therein. The modulated carrier signal is amplified by the power amplifier 3 and input to the output monitor circuit 4. The monitor circuit 4 transmits most (e.g., 99%) of the amplified signal to the transmission signal output terminal 5 as the transmitter output, and captures a part (e.g., 1%) of the amplified signal output for use as a monitor signal.

The monitor signal is envelope detected by the envelope detector 6, and the result is output as the detection signal Vdet. The detection signal Vdet is compared with the burst control signal output from the burst control circuit 10 by the differential amplifier 7, and the result is output as the error signal.

The error signal is input to the sample and hold circuit 8 in which the switch 81 is on. Thus, the error signal is directly supplied to the gain control terminal 31 of the power amplifier 3 as the gain control signal. Thus, during the period t0-t1, a feed-back loop is formed to cause the amplitude of the amplified signal from power amplifier 3 to be substantially equal to the amplitude of the burst control signal. Since the burst control signal, whose pattern has previously been stored in ROM 1003, is in a form of a smooth ramp-up signal (such as a Hanning function signal), the amplified signal also has a smooth ramp-up characteristic.

Then, at time t1, when the ramp-up of the amplified signal reaches a predetermined level, the sample and hold signal changes from a sample signal to a hold signal. Thus, the switch 81 in the sample and hold circuit 8 closes to hold the difference voltage (signal) in a capacitor 82 at that moment and breaks the feed-back loop.

During the next period t1-t2 (a modulated data transmission period), the sample and hold signal is a hold signal to maintain the switch 81 open, causing the voltage of the gain control terminal 31 to be held constant and the gain of the power amplifier 3 to be constant, resulting in the average power level of the amplified signal to be a constantly stable value relative to the voltage after ramp-up of the burst control signal. During this period t1-t2, the digital audio signal is transmitted. It is possible to change the amplified signal power by changing the ramped-up voltage of the burst control signal.

In response to the trailing edge of the trigger signal, the modulated data transmission period ends at time t2. Thus, the sample and hold signal is again changed to the sample signal to close the switch 81 to reestablish the feed-back loop again.

During the next period t2-t3 (a transmission signal ramping-down period), the operation of the burst signal transmitter is essentially the reverse of that during the transmission signal ramping-up period t0-t1. This period t2-t3 is initiated by the trailing edge of the trigger signal and ends when second counter 1002 counts a second predetermined time equal to a period t2-t3. During this period, switch 81 in the sample and hold circuit 8 is returned to the closed position, and at the same time, the modulated carrier signal output from the modulator 1 is a constant envelope signal having no digital audio signal carried therein. Thus, the amplified signal drops on a smooth curve in accordance with the signal pattern stored in ROM 1003.

As described hereinabove, the sample and hold circuit 8 of the first embodiment effectively turns the feed-back loop on and off, making it possible to stabilize the average power level of the output signal during burst transmissions in modulation systems with amplitude modulation. The resulting burst-state transmission output signal has smooth ramp-up/down characteristics and does not produce extraneous interference waves (noise signals) in the frequency domain.

Figure 3:
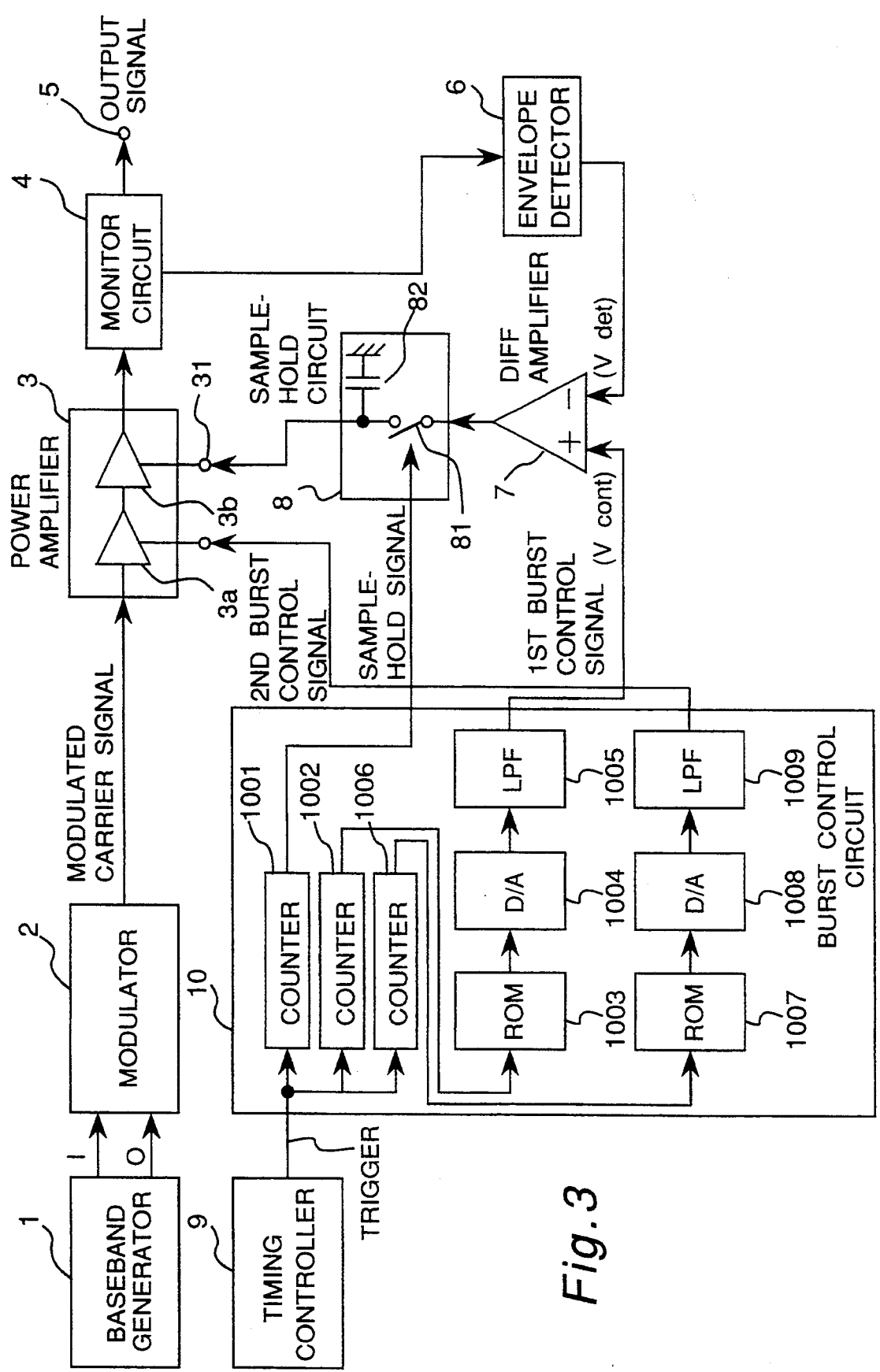
FIG. 3 is a block diagram of a transmitter according to a second embodiment of the present invention.
Figure 4:
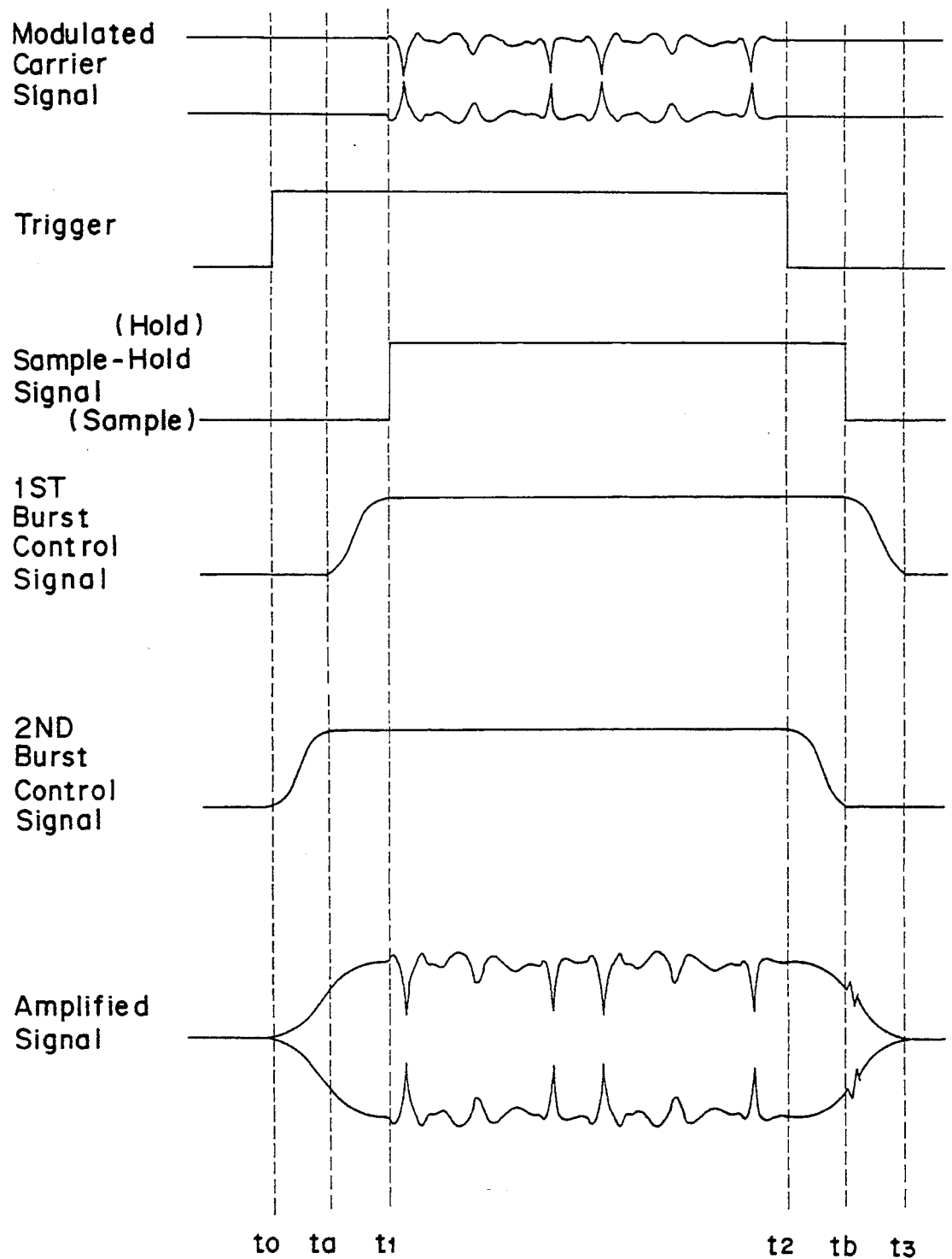
FIG. 4 is a timing chart of the transmitter shown in FIG. 3.

FIGS. 3 and 4 are a block diagram and a timing chart of a transmitter according to the second embodiment of the invention, respectively.

According to the second embodiment, the first counter 1001 forms the sample and hold signal such that, in response to the leading edge of the trigger signal, a predetermined time t0-t1, shown in FIG. 4, is counted so that the sample and hold signal is changed from a LOW to a HIGH level at time t1, and then in response to the trailing edge of the trigger signal, a predetermined time t2-tb is counted so that the sample and hold signal is changed from a HIGH to a LOW level at time tb.

The second counter 1002, ROM 1003, D/A converter 1004 and low pass filter 1005 are provided for forming the first burst control signal such that, in response to the leading edge of the trigger signal, a predetermined time t0-ta is counted and a following predetermined time ta-t1 is counted so that during the time ta-t1 the ROM 1003 reads gradually increasing data to form the ramping-up pattern and, in response to the trailing edge of the trigger signal, a predetermined time t2-tb is counted and a following predetermined time tb-t3 is counted so that during the time tb-t3 the ROM 1003 reads gradually decreasing data to form the ramping-down pattern.

According to the second embodiment, the burst control circuit 10 further has a third counter 1006, a ROM 1007, a D/A converter 1008 and a low pass filter 1009, which are for forming the second burst control signal. In response to the leading edge of the trigger signal, a predetermined time t0-ta is counted so that during that time, the ROM 1006 reads gradually increasing data to form the ramping-up pattern and, in response to the trailing edge of the trigger signal, a predetermined time t2-tb is counted so that during the time t2-tb the ROM 1006 reads gradually decreasing data to form the ramping-down pattern.

The operation of the transmitter shown in FIG. 3 is described below with reference to the timing chart shown in FIG. 4. In FIG. 4, the period t0-t1 is the transmission signal ramping-up period, t1-t2 is the modulated data transmission period, and t2-t3 is the transmission signal ramping-down period.

The operation during the transmission signal ramping-up period (t0-t1) is first explained. During this period, the modulated carrier signal output from the modulator 2 is a constant envelope signal without any digital audio signal carried. The modulated carrier signal is amplified by the power amplifier 3 and input to the output monitor circuit 4. The monitor circuit 4 supplies the amplified signal to the transmission signal output terminal 5 as the transmitter output, and captures part of the transmission output for use as a monitor signal.

The monitor signal is envelope detected by the envelope detector 6, and the result is output as the detection signal Vdet. This detection signal Vdet is compared with the first burst control signal output from the burst control circuit 10 by the differential amplifier 7, and the result is output as the error signal.

The error signal is input to the sample and hold circuit 8 in which the switch 81 is on. Thus, the error signal is directly supplied to the gain control terminal 31 of the amplifier 3. Thus, during period t0-t1, a feed-back loop is formed.

During the first half t0-ta of the transmission signal ramping-up period t0-t1, the second burst control signal output from the burst control circuits 10 rises smoothly. As a result, the amplification rate of the first amplifier 3a is gradually increased so that the amplified signal also rises slowly as controlled by the second burst control signal.

Then, during the second half ta-t1 of the transmission signal ramping-up period t0-t1, the first burst control signal ramps up smoothly. As a result, the amplified signal is feed-back and is controlled according to the first burst control signal. Therefore, the amplified signal rises gradually in the first half t0-ta by the second burst control signal and in the second half ta-t1 by the first burst control signal smoothly.

Then, at time t1, when the ramp-up of the amplified signal reaches a predetermined level, the sample and hold signal changes from a sample signal to a hold signal. Thus, the switch 81 in the sample and hold circuit 8 closes to hold the difference voltage (signal) in a capacitor 82 at that moment and breaks the feed-back loop.

During the next period t1-t2 (a modulated data transmission period), the sample-hold signal is a hold signal to maintain the switch 81 open, causing the voltage of the gain control terminal 31 to be hold constant and the gain of the power amplifier 3 to be constant, resulting in the average power level of the amplified signal to be constantly stable value relative to the voltage after ramp-up of the burst control signal. During this period t1-t2, the digital audio signal is transmitted. It is possible to change the amplified signal power by changing the ramped-up voltage of the burst control signal.

During the first half t2-tb of the transmission signal ramping-down period t2-t3, the second burst control signal ramps down smoothly so that the amplification rate of amplifier 3a is gradually reduced. The sample and hold signal is still output as a hold signal, and the sample and hold circuit 8 therefore remains in a hold state.

During the second half tb-t3 of the transmission signal ramping-down period t2-t3, the sample and hold signal is changed to the sample signal, and the feed-back loop is again formed. The first burst control signal is ramped down during this period, and the amplified signal therefore drops further.

The dynamic range of amplified signal ramp-up/down control can be greatly increased by this process, enabling more precise control of amplified signal characteristics. Furthermore, when the amplified signal level is changed, the operating state of the feed-back control sequence can be held constant to enable stable control irrespective of the amplified signal level by changing the amount of control by the second burst control signal. In addition, the amplified signal ramp-down sequence is first controlled by an open loop dependent upon the second burst control signal, and the sample-hold circuit 8 is changed from the hold to the sample state at a sufficiently low amplified signal level. As a result, the effects of jitter created when the sample-hold circuit 8 changes from a hold to a sample state can be reduced.

Figure 5:
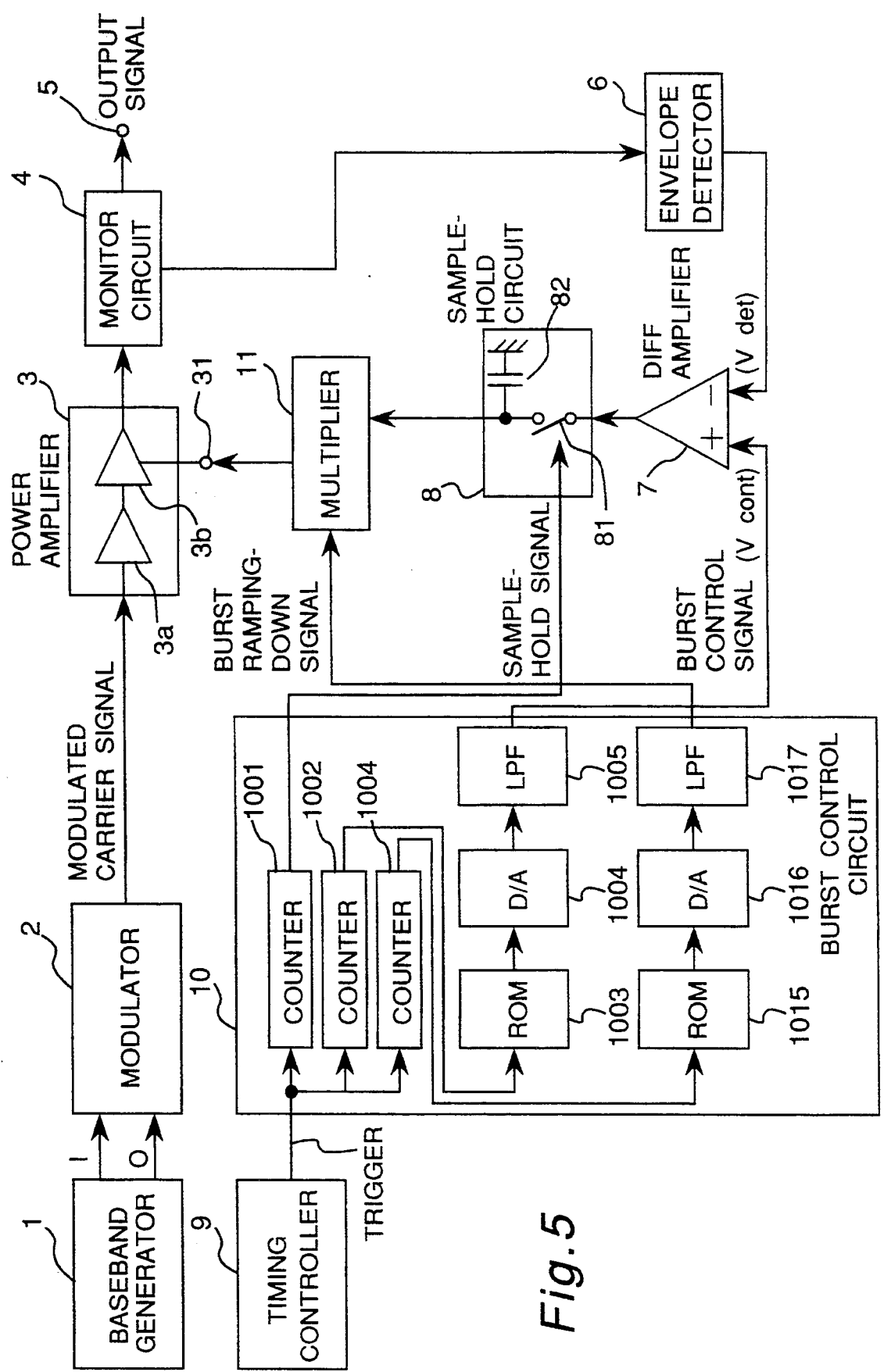
FIG. 5 is a block diagram of a transmitter according to a third embodiment of the present invention.
Figure 6:
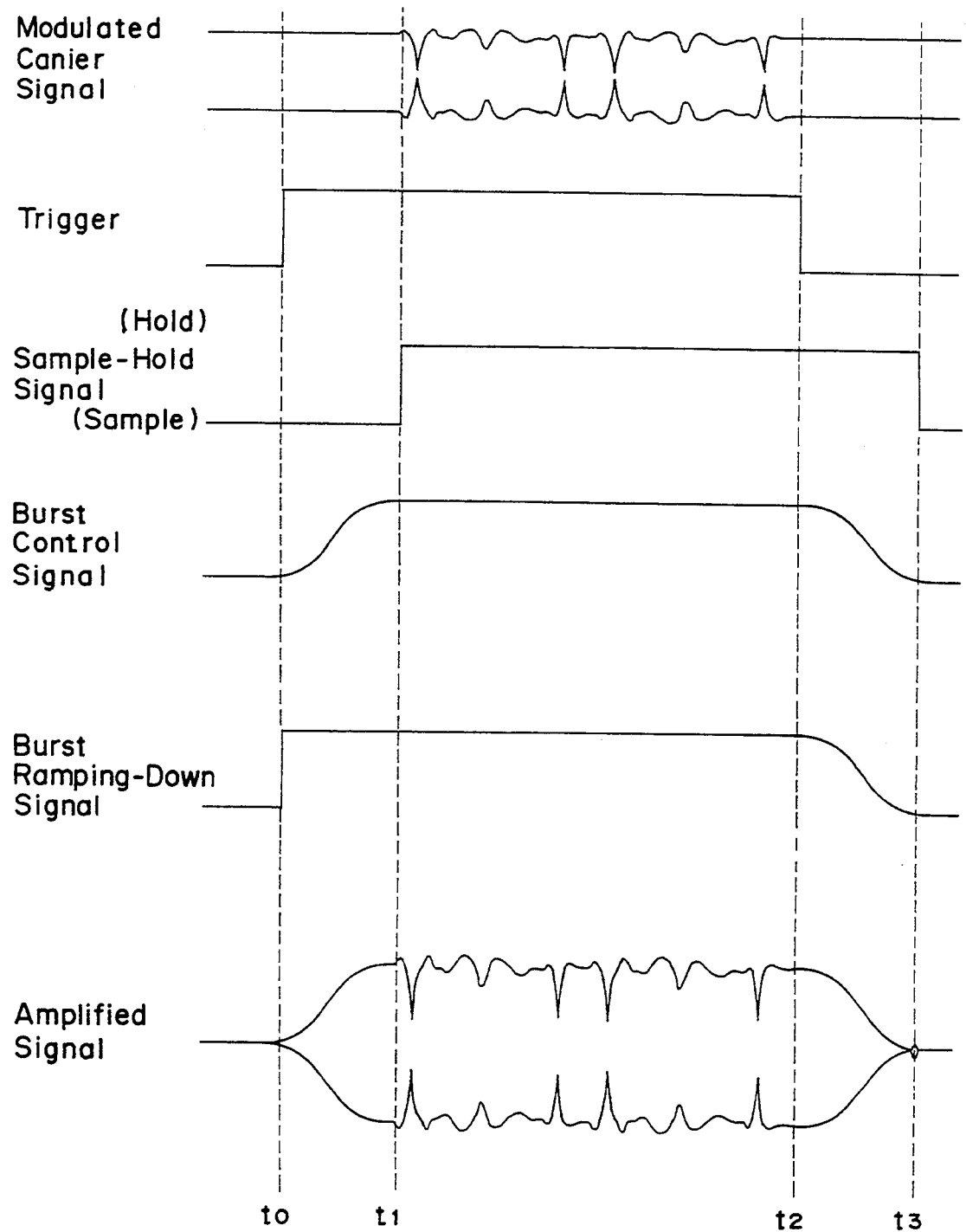
FIG. 6 is a timing chart of the transmitter shown in FIG. 5.

FIGS. 5 and 6 are a block diagram and a timing chart of a transmitter according to the third embodiment of the invention, respectively.

The third embodiment differs from the first embodiment by the addition of a multiplier 11. The multiplier 11 multiplies the output from the sample and hold circuit 8 by the burst ramping-down control signal output from the burst control circuits 10, and supplies the product signal, which is a multiplied gain control signal, to the gain control terminal 31 of the power amplifier 3.

According to the third embodiment, the first counter 1001 forms the sample and hold signal such that, in response to the leading edge of the trigger signal, a predetermined time t0-t1, shown in FIG. 6, is counted so that the sample and hold signal is changed from a LOW to a HIGH level at time t1, and then in response to the trailing edge of the trigger signal, a predetermined time t2-t3 is counted so that the sample and hold signal is changed from a HIGH to a LOW level at time t3.

The second counter 1002, ROM 1003, D/A converter 1004 and low pass filter 1005 are provided for forming burst control signal such that, in response to the leading edge of the trigger signal, a predetermined time t0-t1 is counted so that during the time t0-t1, the ROM 1003 reads gradually increasing data to form the ramping-up pattern and, in response to the trailing edge of the trigger signal, a predetermined time t2-t3 is counted so that during the time t2-t3, the ROM 1003 reads gradually decreasing data to form the ramping-down pattern.

According to the third embodiment, the burst control circuit 10 further has a counter 1014, a ROM 1015, a D/A converter 1016 and a low pass filter 1017, which are for forming a burst ramping-down signal. In response to the leading edge of the trigger signal, ROM 1015 reads a step-up signal at time t0 and, in response to the trailing edge of the trigger signal, a predetermined time t2-t3 is counted so that during the time t2-t3 the ROM 1015 reads gradually decreasing data to form the ramping-down pattern.

The operation of the transmitter shown in FIG. 5 is described below with reference to the timing chart shown in FIG. 6. In FIG. 6, the period t0-t1 is the transmission signal ramping-up period, t1-t2 is the modulated data transmission period, and t2-t3 is the transmission signal ramping-down period.

The operation during the transmission signal ramping-up period t0-t1 is first described. During this period, the modulated carrier signal output from the modulator 2 is a constant envelope signal without any digital audio signal. The modulated carrier signal is amplified by the power amplifier 3 and input to the output monitor circuit 4. The monitor circuit 4 supplies the amplified signal to the transmission signal output terminal 5 as the transmitter output, and captures part of the transmission output for use as a monitor signal.

The monitor signal is envelope detected by the envelope detector 6, and the result is output as the detection signal Vdet. The detection signal Vdet is compared with the burst control signal output from the burst control circuit 10 by the differential amplifier 7, and the result is output as the error signal.

The error signal is input to the sample-hold circuit 8, and is output therefrom because the switch 81 is on at this time.

The multiplier 11 multiplies the output from the sample-hold circuit 8 by the burst ramping-down signal. The output of the sample-hold circuit 8 is output directly at this time because the value of the burst ramping-down signal is +1.

The output of the multiplier 11 is input to the gain control terminal 31 of the power amplifier 3 to form a feed back loop.

The amplified signal is feed-back controlled according to the burst control signal and results in a smooth ramp-up of the output because the burst control signal has a smooth ramp-up characteristic (e.g., such as a Hanning function signal). By changing the sample and hold signal from a sample signal to a hold signal when the ramp-up of the amplified signal has peaked (t1), the sample and hold circuit 8 holds the difference voltage (signal) and breaks the feed-back loop.

During the following modulated data transmission period t1-t2, the sample and hold signal is a hold signal and the burst ramping-down signal value remains +1, causing the voltage of the gain control terminal 31 to be held constant and the gain of the power amplifier 3 to be constant, resulting in the average power level of the amplified signal to be a constantly stable value relative to the voltage after ramp-up of the burst control signal. It follows that the amplified signal power can be changed by changing the ramped-up voltage of the burst control signal.

During the following transmission signal ramping-down period t2-t3 the burst ramping-down signal drops on a smooth curve. The sample and hold signal is output as a hold signal, and the sample and hold circuit 8 therefore remains in a hold state. The multiplier 11 output therefore drops smoothly, and the amplified signal also drops as controlled by the multiplier 11 output signal.

With the third embodiment of a burst signal transmitter, it is not necessary to consider jitter caused by the sample and hold circuit 8 changing from a hold state to a sample signal, and the amplified signal will ramp down according to a stable, smooth curve.

Figure 7:
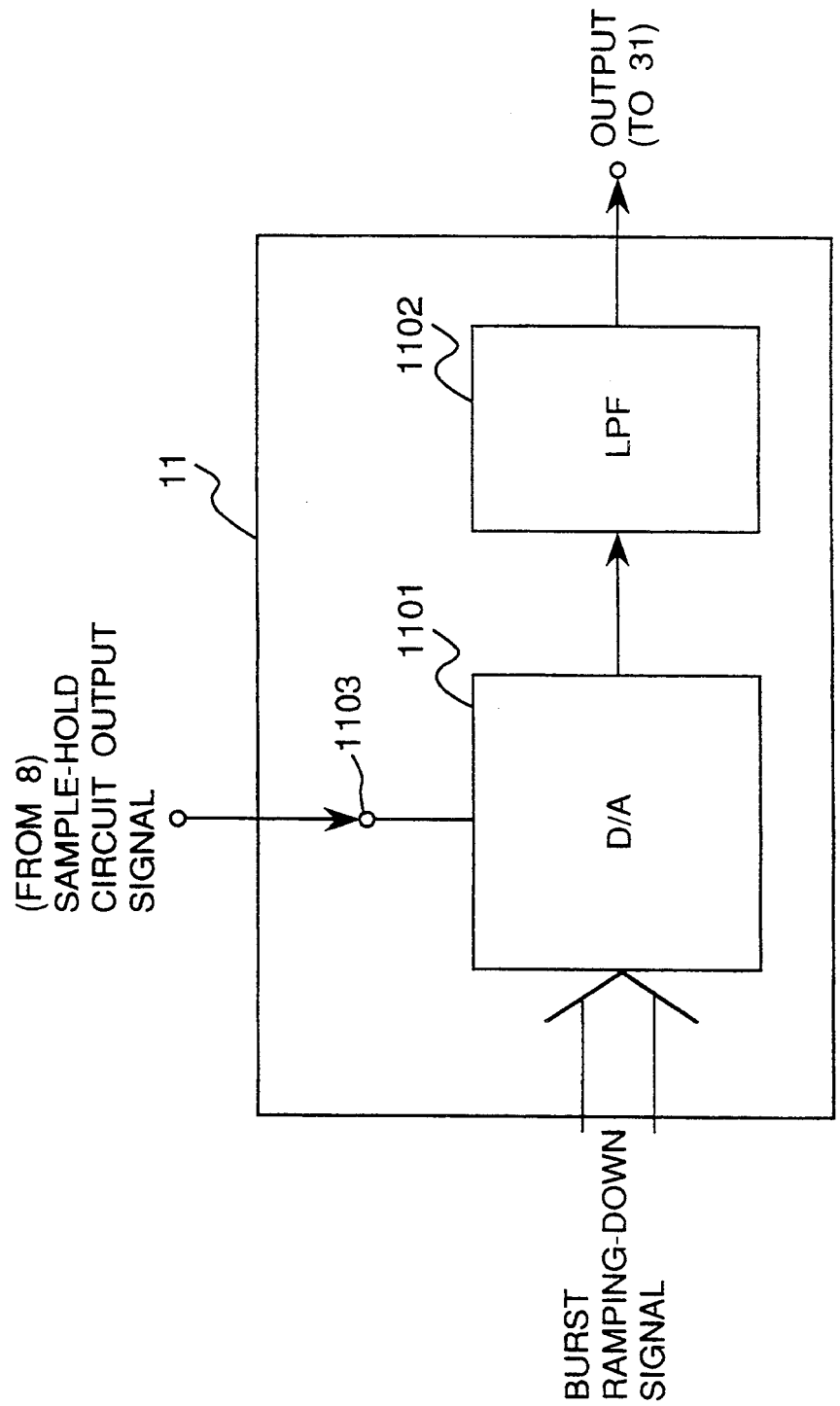
FIG. 7 is a block diagram of the multiplier used in the transmitter of FIG. 5.

FIG. 7 is a block diagram of one example of the multiplier 11 used in the third embodiment.

As shown in FIG. 7, the multiplier 11 comprises a D/A converter 1101 for performing digital multiplication operations, a low-pass filter (LPF) 1102 for removing the reference clock from the D/A converter 1101 output, and a reference voltage terminal 1103 for receiving the held error signal from the sample-hold circuit 8.

The operation of the multiplier 11 is described below.

The held error signal from the sample and hold circuit 8 is input to the reference voltage terminal 1103 of the D/A converter 1101. The D/A converter 1101 is controlled by the digital burst ramping-down signal to perform a digital multiplication operation. By filtering the D/A converter 1101 output with a LPF 1102, the reference clock can be removed from the multiplier 11 output. This construction can thus provide a more stable multiplying operation than can be achieved with an analog multiplier, resulting in an extremely stable burst ramping-down signal.

Figure 8:
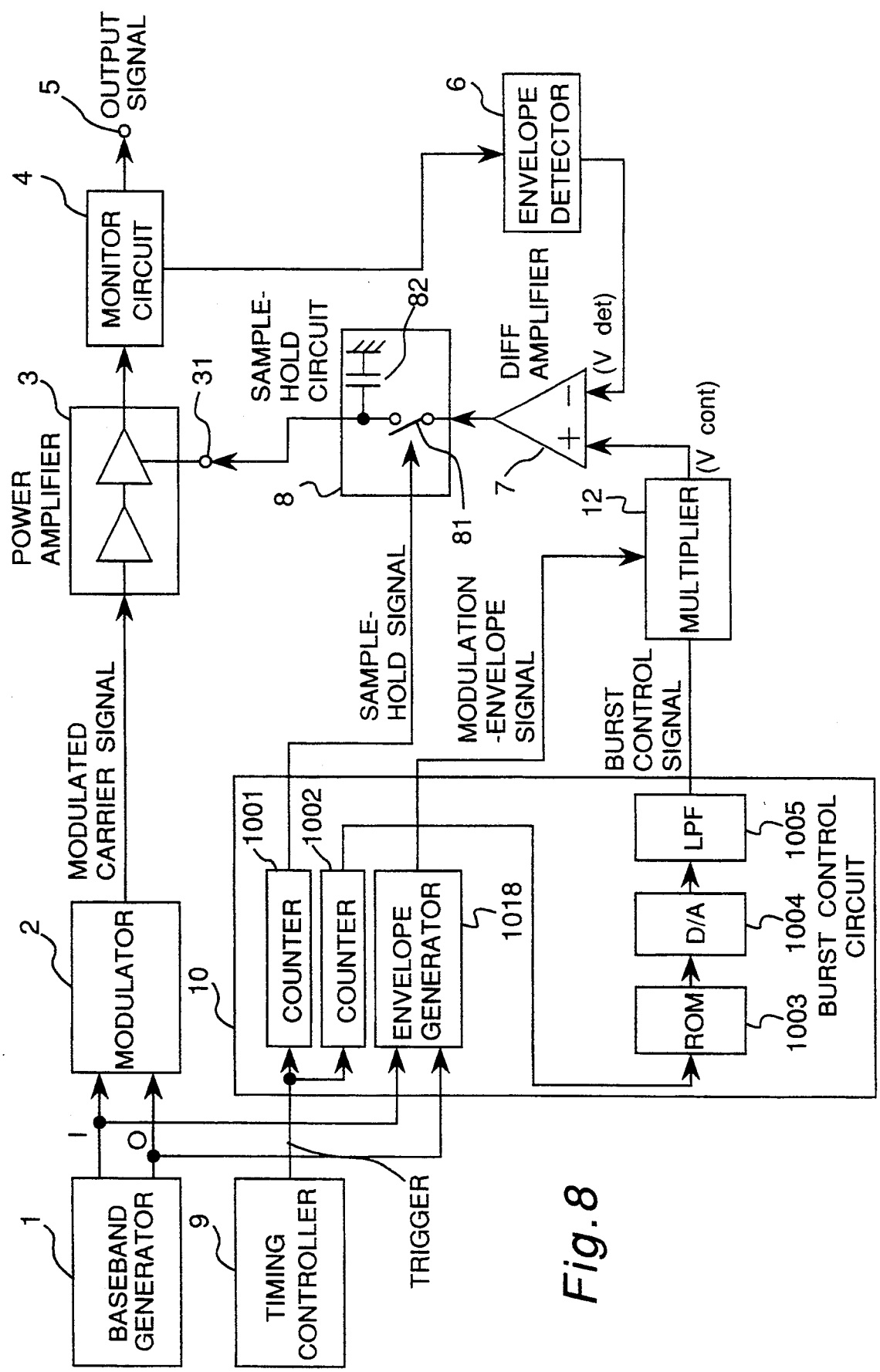
FIG. 8 is a block diagram of a transmitter according to a fourth embodiment of the present invention.

FIG. 8 is a block diagram of a transmitter according to the fourth embodiment of the invention.

The fourth embodiment differs from the first embodiment by the addition of a multiplier 12 that multiplies the burst control signal by a modulation envelope signal output from an envelope generator 1018 in the burst control circuit 10 to generate the multiplied burst control signal Vcont input to the differential amplifier 7. The envelope generator 1018 receives the modulation baseband signals (I, $\Omega$) and calculates and produces $(I^2+\Omega^2)^{\frac{1}{2}}$ as the modulation envelope signal.

According to the fourth embodiment, the modulator 2 does not need to supply a constant envelope signal as the modulated carrier signal during the transmission signal ramping-up period (t0–t1). As a result, there is a greater degree of freedom allowed in the modulator 2 design, making it much easier to realize the modulator 2 and overall design.

Figure 9:
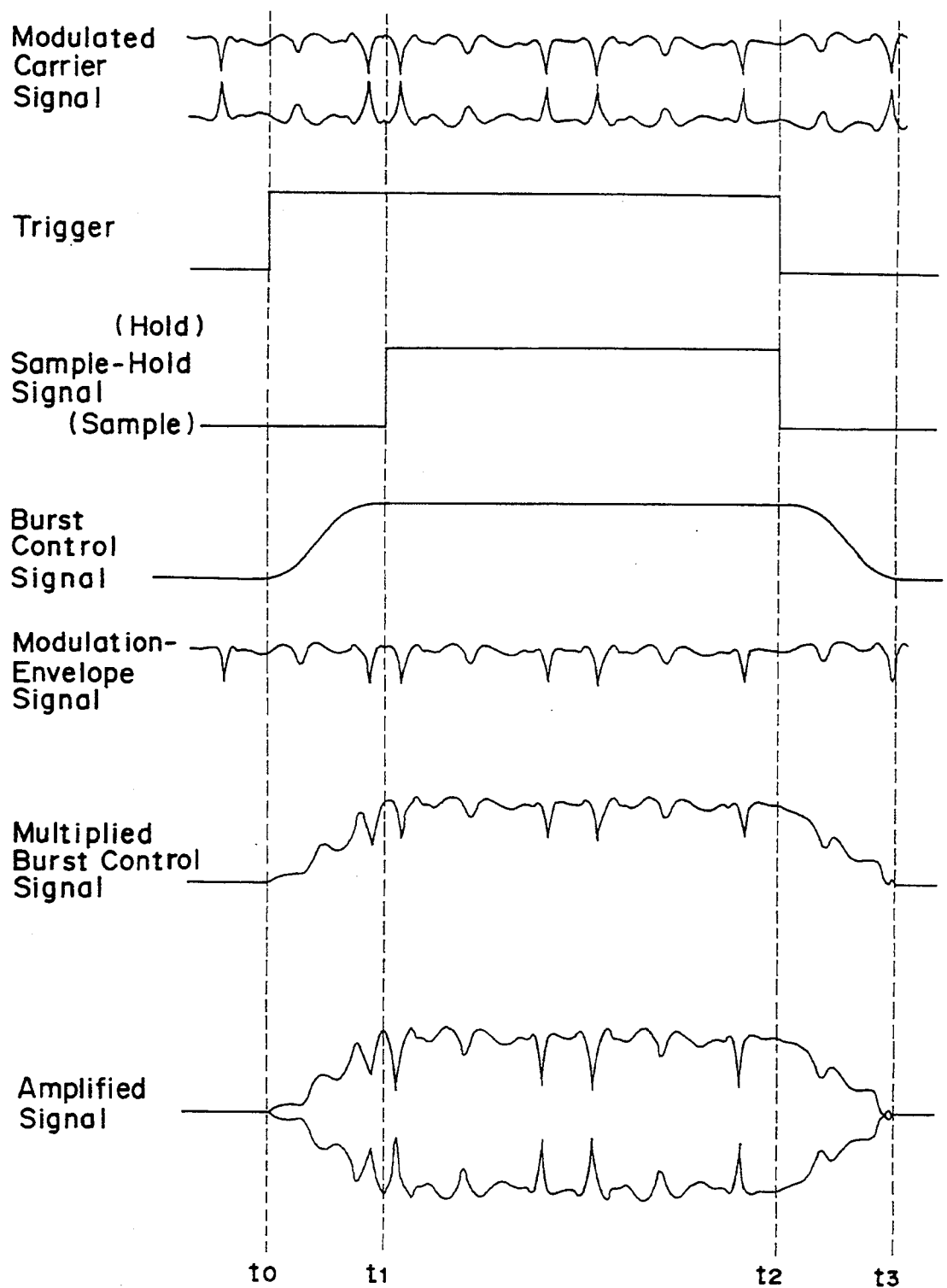
FIG. 9 is a timing chart of the transmitter shown in FIG. 8.

The operation of the transmitter shown in FIG. 8 is described below with reference to the timing chart shown in FIG. 9. In FIG. 9, the period t0–t1 is the transmission signal ramping-up period, t1–t2 is the modulated data transmission period, and t2–t3 is the transmission signal ramping-down period.

The operation during the transmission signal ramping-up period t0–t1 is first described. During this period, the modulated carrier signal output from the modulator 2 is a constant envelope signal without any digital audio signal. The modulated carrier signal is amplified by the power amplifier 3 and input to the output monitor circuit 4. The monitor circuit 4 supplies the amplified signal to the transmission signal output terminal 5 as the transmitter output, and captures part of the transmission output for use as a monitor signal.

The monitor signal is envelope detected by the envelope detector 6, and the result is output as the detection signal Vdet. The detection signal Vdet is compared with a modified burst control signal Vcont by the differential amplifier 7, and the result is output as the error signal. In this embodiment, the multiplied burst control signal Vcont is produced from the multiplier 12 and is obtained by multiplying the burst control signal by the modulation envelope signal. In this embodiment, the burst control signal and the sample-hold signal are the same as those of the first embodiment as described above in connection with FIG. 2.

The error signal is input to the sample and hold circuit 8, and is output therefrom because the switch 81 is on at this time.

The amplified signal is feed-back controlled according to the modified burst control signal and results in a ramp-up of the modulated carrier signal with the digital audio signal carrier thereon, because the modified burst control signal carries the digital audio signal component. By changing the sample and hold signal from a sample signal to a hold signal at time t1, the sample-hold circuit 8 holds the difference voltage (signal) and breaks the feed-back loop.

During the following modulated data transmission period t1–t2, the sample and hold signal is a hold signal, causing the voltage of the gain control terminal 31 to be held constant and the gain of the power amplifier 3 to be constant, resulting in the average power level of the amplified signal to be constantly stable value relative to the voltage after ramp-up of the burst control signal. It follows that the amplified signal power can be changed by changing the ramped-up voltage of the burst control signal.

During the following transmission signal ramping-down period t2–t3 the modified burst control signal drops relatively to the burst control signal. The sample and hold signal is output as a hold signal, and the sample and hold circuit 8 therefore remains in a hold state.

By the fourth embodiment, during the transmission signal ramping-up period t1–t2, it is not necessary for the modulator 2 to produce a modulated carrier signal without the digital audio signal, because at time t1, the modified burst control signal and the detection signal Vdet will have the same amplitude. Thus, by the fourth embodiment, the baseband generator 1 and the modulator 2 can be formed with a high freedom of design.

Figure 10:
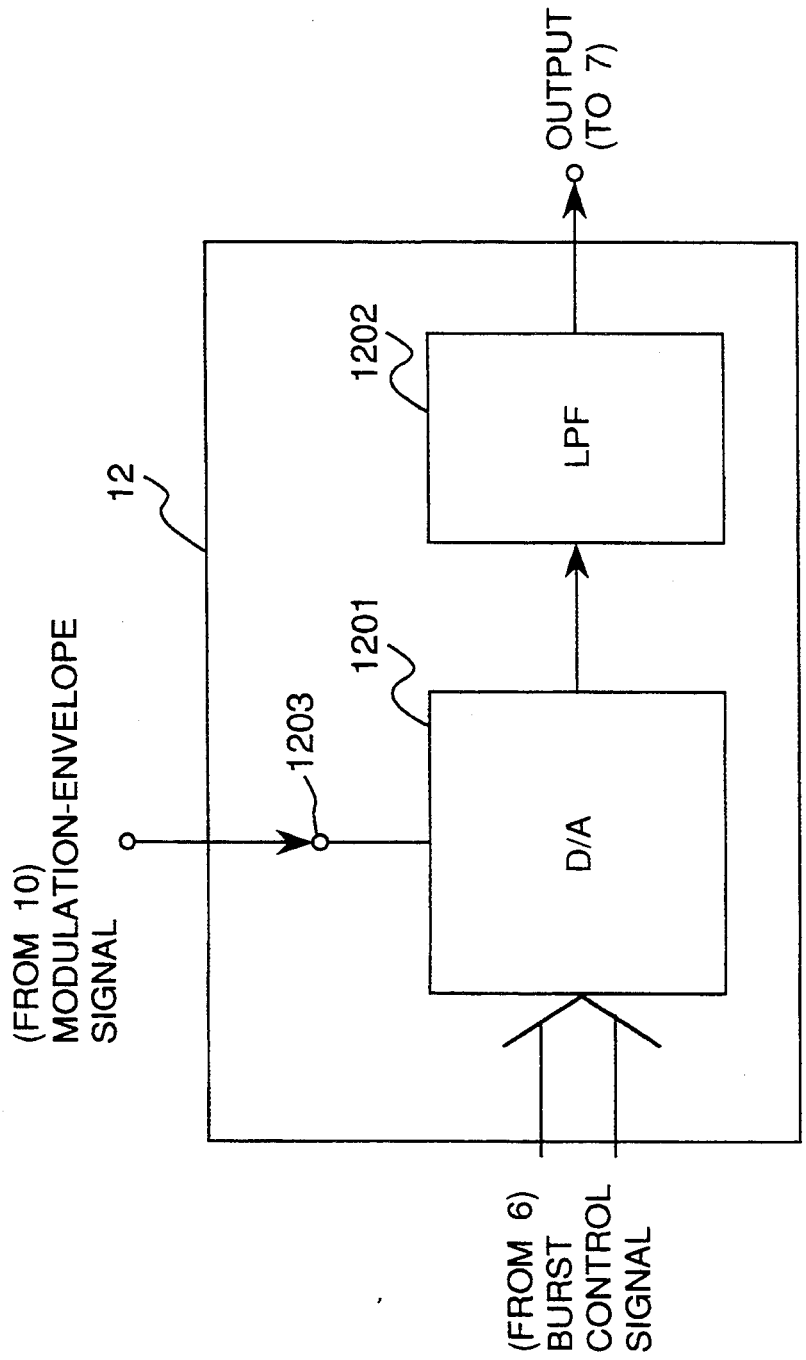
FIG. 10 is a block diagram of the multiplier used in the transmitter of FIG. 8.

FIG. 10 is a block diagram of the multiplier 12 used in the transmitter of the fourth embodiment of the present invention.

As shown in FIG. 10, the multiplier 12 comprises a D/A converter 1201 for performing digital multiplication operations, a low-pass filter 1202 for removing the reference clock from the D/A converter 1201 output, and a reference voltage terminal 1203 for the D/A converter 1201.

The operation of the multiplier 12 thus comprised is described below.

The modulation envelope signal from the burst control circuits 6 is input to the reference voltage terminal 1203 of the D/A converter 1201. The D/A converter 1201 is controlled by the digital burst control signal to perform a digital multiplication operation. By filtering the D/A converter 1201 output with a LPF 1202; the reference clock can be removed from the multiplier 12 output. This construction can thus provide a more stable multiplying operation than can be achieved with an analog multiplier, resulting in extremely stable burst control.

It is to be noted that the multiplier 12, as well as the envelope generator 1018, can be provided in any one of the preceding embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A transmitter comprising:

a modulator for generating a modulation carrier signal, and generating a signal during a burst ramp-up period for use as a constant envelope;

a power amplifier, comprising a gain control terminal, for amplifying said modulation carrier signal and producing an amplified transmission signal;

a monitor circuit for extracting a part of said amplified transmission signal;

an envelope detector for obtaining an envelope detection signal of the monitor signal;

a first burst control signal generator for generating a first burst control signal;

a differential amplifier for comparing said first burst control signal and said envelope detection signal, and producing an error signal indicative of a difference between said first burst control signal and said envelope detection signal;

a sample and hold signal generator for generating a sample and hold signal;

a sample and hold circuit for sampling and holding said error signal according to the sample and hold signal to produce a gain control signal which is supplied to said gain control terminal of the power amplifier; and a timing controller for providing trigger signals to said first burst control signal generator and to said sample and hold signal generator;

wherein said first burst control signal generator comprises: a first digital counter for starting and ending counting in response to the trigger signals; a read only memory connected to said first digital counter for generating predetermined rising and falling patterns in digital form for the first burst control signal; a digital to analog converter for converting the rising and falling patterns in digital form to rising and falling patterns in analog form; and a low pass filter for smoothing the rising and falling patterns in analog form;

and wherein said sample and hold signal generator comprises a second digital counter for starting and ending counting in response to the trigger signals;

and wherein said sample and hold signal generator generates said sample and hold signal such that said signal is in a sampling state during a burst rising period and a burst falling period and is in a hold state during a burst transmission period and samples a rising pattern during said burst rising period and holds a last level of said rising pattern during said transmission period and samples a falling pattern during said burst falling period.

2. A transmitter according to claim 1, further comprising a second burst control signal generator for generating a second burst control signal, and wherein said power amplifier comprises a first amplifier for receiving said modulation carrier signal and having another gain control terminal for receiving said second burst control signal and a second amplifier whose input is connected to an output of said first amplifier and having said gain control terminal for receiving said gain control signal;

wherein said second burst control signal generator comprises: a third digital counter for starting and ending counting in response to the trigger signals; another read only memory connected to said third digital counter for generating predetermined rising and falling patterns in digital form for the second burst control signal; another digital to analog converter for converting the rising and falling patterns in digital form to rising and falling patterns in analog form; and another low pass filter for smoothing the rising and falling patterns in analog form;

and wherein a burst is just dropped by said second burst control signal in a first half of a trailing edge of the burst and is then dropped by said first burst control signal while said sample and hold signal remains in a sampling state during a latter half of a trailing edge of the burst;

and wherein said second burst control signal generator generates said second burst control signal such that said second burst control signal samples a rising pattern during a first half of said burst rising period and holds a last level of said rising pattern during a second half of said burst rising period and during said transmission period and samples said falling pattern during a first half of said burst falling period and holds a last level of said falling pattern during a second half of said burst falling period.

3. A transmitter comprising:

a modulator for generating a modulation carrier signal, and generating a signal during a burst ramp-up period for use as a constant envelope;

a power amplifier, comprising a gain control terminal, for amplifying said modulation carrier signal and producing an amplified transmission signal;

a monitor circuit for extracting a part of said amplified transmission signal;

an envelope detector for obtaining an envelope detection signal of the monitor signal;

a first burst control signal generator for generating a first burst control signal;

a differential amplifier for comparing said first burst control signal and said envelope detection signal, and producing an error signal indicative of a difference between said first burst control signal and said envelope detection signal;

a sample and hold signal generator for generating a sample and hold signal;

a sample and hold circuit for sampling and holding said error signal according to the sample and hold signal to produce a gain control signal which is supplied to said gain control terminal of the power amplifier; and a timing controller for providing trigger signals to said first burst control signal generator and to said sample and hold signal generator;

wherein said first burst control signal generator comprises; a first digital counter for starting and ending counting in response to the trigger signals; a read only memory connected to said first digital counter for generating predetermined rising and falling patterns in digital form for the first burst control signal; a digital to analog converter for converting the rising and falling patterns in digital form to rising and falling patterns in analog form; and a low pass filter for smoothing the rising and falling patterns in analog form;

and wherein said sample and hold signal generator comprises a second digital counter for starting and ending counting in response to the trigger signals; said transmitter further comprising:

a burst ramping-down signal generator for generating a burst ramping-down signal; and a multiplier provided between said sample and hold circuit and said power amplifier for multiplying said gain control signal from said sample and hold circuit by said burst ramping-down control signal to produce a multiplied gain control signal which is inputted to said gain control terminal of said power amplifier.

4. A transmitter according to claim 3, wherein said multiplier comprises a digital-to-analog converter whose output is connected to an input of a filter, and wherein said digital-to-analog converter of said multiplier receives the gain control signal from said sample and hold circuit as a reference voltage and converts said burst ramping-down control signal in a digital form to an amplified analog signal.

5. A transmitter comprising:

a modulator for generating a modulation carrier signal;

a power amplifier, comprising a gain control terminal, for amplifying said modulation carrier signal and producing an amplified transmission signal;

a monitor circuit for extracting a part of said amplified transmission signal;

an envelope detector for obtaining an envelope detection signal of the monitor signal;

a first burst control signal generator for generating a first burst control signal;

a modulation envelope signal generator for producing a modulation envelope signal;

a multiplier for multiplying said burst control signal by said modulation envelope signal to produce a multiplied burst control signal a differential amplifier for comparing said multiplied burst control signal and said envelope detection signal, and producing an error signal indicative of a difference between said multiplied burst control signal and said envelope detection signal;

a sample and hold signal generator for generating a sample and hold signal;

a sample and hold circuit for sampling and holding said error signal according to the sample and hold signal to produce a gain control signal which is supplied to said gain control terminal of the power amplifier;

a timing controller for providing trigger signals to said first burst control signal generator and to said sample and hold signal generator;

wherein said first burst control signal generator comprises: a first digital counter for starting and ending counting in response to the trigger signals; a read only memory connected to said first digital counter for generating predetermined rising and falling patterns in digital form for the first burst control signal; a digital to analog converter for converting the rising and falling patterns in digital form to rising and falling patterns in analog form; and a low pass filter for smoothing the rising and falling patterns in analog form;

and wherein said sample and hold signal generator comprises a second digital counter for starting and ending counting in response to the trigger signals;

and wherein said sample and hold signal generator generates said sample and hold signal such that said signal is in a sampling state during a burst rising period and a burst falling period and is in a hold state during a burst transmission period and samples a rising pattern during said burst rising period and holds a last level of said rising pattern during said transmission period and samples a falling pattern during said burst falling period.

6. A transmitter comprising:

a modulator for generating a modulation carrier signal;

a power amplifier, comprising a gain control terminal, for amplifying said modulation carrier signal and producing an amplified transmission signal;

a monitor circuit for extracting a part of said amplified transmission signal;

an envelope detector for obtaining an envelope detection signal of the monitor signal;

a first burst control signal generator for generating a first burst control signal;

a modulation envelope signal generator for producing a modulation envelope signal;

a multiplier for multiplying said burst control signal by said modulation envelope signal to produce a multiplied burst control signal a differential amplifier for comparing said multiplied burst control signal and said envelope detection signal, and producing an error signal indicative of a difference between said multiplied burst control signal and said envelope detection signal;

a sample and hold signal generator for generating a sample and hold signal;

a sample and hold circuit for sampling and holding said error signal according to the sample and hold signal to produce a gain control signal which is supplied to said gain control terminal of the power amplifier;

a timing controller for providing trigger signals to said first burst control signal generator and to said sample and hold signal generator;

wherein said first burst control signal generator comprises: a first digital counter for starting and ending counting in response to the trigger signals; a read only memory connected to said first digital counter for generating predetermined rising and falling patterns in digital form for the first burst control signal; a digital to analog converter for converting the rising and falling patterns in digital form to rising and falling patterns in analog form; and a low pass filter for smoothing the rising and falling patterns in analog form;

and wherein said sample and hold signal generator comprises a second digital counter for starting and ending counting in response to the trigger signals;

and wherein said multiplier comprises a digital-to-analog converter whose output is connected to an input of a filter, and wherein said digital-to-analog converter of said multiplier receives the modulation envelope signal as a reference voltage and converts said burst control signal in a digital form to an amplified analog signal.

7. A transmitter comprising: a modulator for generating a modulation carrier signal, and generating a signal during a burst ramp-up period for use as a constant envelope;

a power amplifier, comprising a gain control terminal, for amplifying said modulation carrier signal and producing an amplified transmission signal;

a monitor circuit for extracting a part of said amplified transmission signal;

an envelope detector for obtaining an envelope detection signal of the monitor signal;

a first burst control signal generator for generating a first burst control signal;

a differential amplifier for comparing said first burst control signal and said envelope detection signal, and producing an error signal indicative of a difference between said first burst control signal and said envelope detection signal;

a sample and hold signal generator for generating a sample and hold signal;

a sample and hold circuit for sampling and holding said error signal according to the sample and hold signal to produce a gain control signal which is supplied to said gain control terminal of the power amplifier;

a burst ramping-down signal generator for generating a burst ramping-down signal; and a multiplier provided between said sample and hold circuit and said power amplifier for multiplying said gain control signal from said sample and hold circuit by said burst ramping-down control signal to produce a multiplied gain control signal which is inputted to said gain control terminal of said power amplifier.

8. A transmitter according to claim 7, wherein said multiplier comprises a digital-to-analog converter whose output is connected to an input of a filter, and wherein said digital-to-analog converter receives the gain control signal from said sample-hold circuit as a reference voltage and converts said burst ramping-down control signal in a digital form to an amplified analog signal.

9. A transmitter comprising:

a modulator for generating a modulation carrier signal;

a power amplifier, comprising a gain control terminal, for amplifying said modulation carrier signal and producing an amplified transmission signal;

a monitor circuit for extracting a part of said amplified transmission signal;

an envelope detector for obtaining an envelope detection signal of the monitor signal;

a first burst control signal generator for generating a first burst control signal;

a modulation envelope signal generator for producing a modulation envelope signal;

a multiplier for multiplying said burst control signal by said modulation envelope signal to produce a multiplied burst control signal a differential amplifier for comparing said multiplied burst control signal and said envelope detection signal, and producing an error signal indicative of a difference between said multiplied burst control signal and said envelope detection signal;

a sample and hold signal generator for generator a sample and hold signal; and a sample and hold circuit for sampling and holding said error signal according to the sample and hold signal to produce a gain control signal which is supplied to said gain control terminal of the power terminal;

wherein said multiplier comprises a digital-to-analog converter whose output is connected to an input of a filter, and wherein said digital-to-analog converter receives the modulation envelope signal as a reference voltage and converts said burst control signal in a digital form to an amplified analog signal.

* * * * *